(12) United States Patent
Song et al.

(10) Patent No.: US 11,098,401 B2
(45) Date of Patent: Aug. 24, 2021

(54) METHOD OF FORMING WIRING ON SIDE PORTION OF SUBSTRATE

(71) Applicant: TETOS Co., Ltd., Asan-si (KR)

(72) Inventors: Kun Ho Song, Asan-si (KR); Yeong Ung Park, Cheonan-si (KR)

(73) Assignee: TETOS Co., Ltd., Asan-si (KR)

( * ) Notice: Subject to any disclaimer, the term of this patent is extended or adjusted under 35 U.S.C. 154(b) by 68 days.

(21) Appl. No.: 16/449,476

(22) Filed: Jun. 24, 2019

(65) Prior Publication Data

US 2020/0022263 A1 Jan. 16, 2020

(30) Foreign Application Priority Data

Jul. 11, 2018 (KR) .......................... 10-2018-0080297

(51) Int. Cl.
| | |
|---|---|
| *C23C 14/04* | (2006.01) |
| *C23C 14/50* | (2006.01) |
| *C23C 14/22* | (2006.01) |
| *C23C 14/34* | (2006.01) |
| *H01J 37/34* | (2006.01) |
| *H05K 3/14* | (2006.01) |
| *H05K 3/16* | (2006.01) |

(52) U.S. Cl.
CPC ............ *C23C 14/04* (2013.01); *C23C 14/042* (2013.01); *C23C 14/225* (2013.01); *C23C 14/34* (2013.01); *C23C 14/3464* (2013.01); *C23C 14/50* (2013.01); *C23C 14/505* (2013.01); *H01J 37/3417* (2013.01); *H05K 3/143* (2013.01); *H05K 3/16* (2013.01)

(58) Field of Classification Search
CPC ... C23C 14/04; C23C 14/042; C23C 14/3464; C23C 14/50; C23C 14/505; C23C 14/14; C23C 14/022; C23C 14/025; C23C 14/352; C23C 14/562; C23C 14/225; H05K 3/143; H05K 1/181; H05K 3/16; H05K 3/146; H01J 37/3417
See application file for complete search history.

(56) References Cited

U.S. PATENT DOCUMENTS

| | | | |
|---|---|---|---|
| 6,280,580 B1 * | 8/2001 | Suh ....................... | C23C 14/505 204/192.26 |
| 9,260,780 B2 * | 2/2016 | Kusunoki ........... | C23C 14/3464 |
| 2020/0043696 A1 * | 2/2020 | Song ................... | H01J 37/3447 |

FOREIGN PATENT DOCUMENTS

KR        10-1613773 B1    4/2016

* cited by examiner

*Primary Examiner* — Michael A Band
(74) *Attorney, Agent, or Firm* — Revolution IP, PLLC

(57) ABSTRACT

Disclosed is a method of forming wiring of a substrate includes masking a substrate side portion, on which the wiring will be formed, by attaching a deposition mask to the substrate; and forming the wiring on the substrate side portion based on sputtering after introducing the masked substrate into a chamber.

2 Claims, 3 Drawing Sheets

METHOD OF FORMING WIRING ON SIDE PORTION OF SUBSTRATE

CROSS-REFERENCE TO RELATED APPLICATION

This application claims priority from Korean Patent Application No. 10-2018-0080297, filed on Jul. 11, 2018 in the Korean Intellectual Property Office, the disclosure of which is incorporated herein by reference.

BACKGROUND OF THE INVENTION

(a) Field of the Invention

The disclosure relates to a method of forming wiring on a substrate, and more particularly to a method of forming wiring on a side portion of a substrate, in which sputtering is used to form the wiring on the side portion of the substrate, thereby forming the wiring with low resistance and thus providing the substrate improved in electric characteristics.

(b) Description of the Related Art

Wiring for a circuit for connecting elements, supplying power and transceiving an electric signal is formed on a substrate to which various semiconductors and the like electronic elements are mounted. To form the wiring on the substrate, various wiring forming methods may be used.

Recently, a silk printing technique has been employed to form the wiring on the substrate. In other words, the method of forming the wiring on the substrate based on the silk printing technique refers to a method of employing the silk printing technique to apply a silver paste and form high-conductive wiring onto the substrate.

However, such a conventional method of forming the wiring on the substrate based on the silk printing technique has shortcomings that electric characteristics of a wiring circuit is not uniform due to high resistance of the wiring, external influences of a material to be coated, and low-uniformity of the material when the material is applied. Further, such a wet process has disadvantages that physical electric characteristics of an end product are affected by contamination with impurities.

Meanwhile, there has recently been a growing interest in a technique for forming a substrate without a bezel to achieve a large-screen and high-definition display. To provide the bezel-less substrate, a technique is required to form the wiring on a lateral side of a substrate is required.

Regarding the technique for providing the bezel-less substrate, Korean Patent No. 10-1613773 (hereinafter, referred to as the "related art") has disclosed a touch panel in which metal wiring connected to a Tx electrode pattern and an Rx electrode pattern is extended and connected to a lateral side and a back side of a display apparatus in order to reduce a width of a bezel and increase an active area.

The related art discloses only the panel decreased in the width of the bezel by forming the wiring on the lateral side of the substrate, but does not explicitly teach a concrete method of forming the wiring on the lateral side of the substrate.

Besides, the related art does not propose any specific method of forming wiring, which has low resistance and is excellent in electric characteristics, on a side portion of the substrate.

SUMMARY OF THE INVENTION

Accordingly, the disclosure is conceived to solve the foregoing problems, and an aspect of the disclosure is to provide a method of forming wiring on a side portion of a substrate, in which sputtering is used to form the wiring on the side portion of the substrate, thereby forming the wiring with low resistance and thus providing the substrate improved in electric characteristics.

Another aspect of the disclosure is to provide a method of forming wiring on a side portion of a substrate, in which a top circuit pattern and a bottom circuit pattern of the substrate are electrically connectable through the wiring formed by sputtering to the side portion, thereby removing a bezel and thus achieve a large-screen and high-definition display apparatus.

In accordance with an embodiment of the present disclosure, there is provided a method of forming wiring of a substrate, including: masking a substrate side portion, on which the wiring will be formed, by attaching a deposition mask to the substrate; and forming the wiring on the substrate side portion based on sputtering after introducing the masked substrate into a chamber.

The substrate side portion may include a lateral side of the substrate, and a top and bottom of the substrate adjacent to the lateral side, and the wiring on the substrate side portion may be configured to electrically connect a top circuit pattern formed on a top of the substrate and a bottom circuit pattern formed on a bottom of the substrate.

The wiring to be formed on the substrate side portion may be deposited inside the chamber based on sputtering using a central source target disposed to face a lateral side of the substrate, and side source targets disposed at opposite sides of the central source target and inclined toward the substrate.

The substrate may be disposed as mounted to a jig inside the chamber, rotatable with respect to a lengthwise direction of the substrate, and adjustable in angle to face toward the central source target.

BRIEF DESCRIPTION OF THE DRAWINGS

The above and/or other aspects of the disclosure will become apparent and more readily appreciated from the following description of the exemplary embodiments, taken in conjunction with the accompanying drawings, in which.

DETAILED DESCRIPTION

Figure 1:
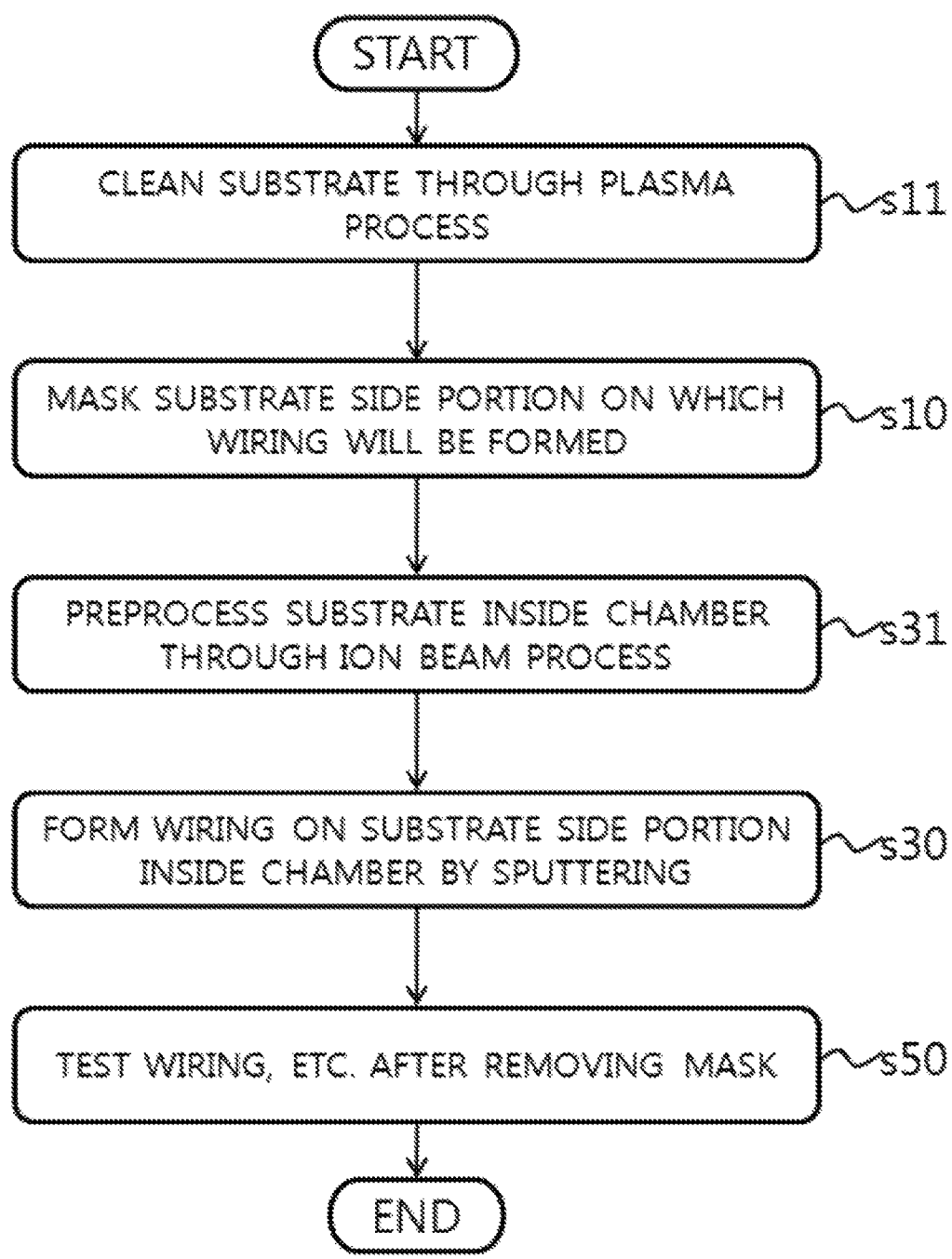
FIG. 1 is a flowchart showing a method of forming wiring on a side portion of a substrate according to an embodiment of the disclosure.

FIG. 1 is a flowchart showing a method of forming wiring on a side portion of a substrate according to an embodiment of the disclosure.

As shown in FIG. 1, a method of forming wiring on a side portion of a substrate according to an embodiment of the disclosure first performs masking a substrate side portion (see '10' in FIG. 2) on which the wiring will be formed. Specifically, a sputtering method is a key method of forming wiring on a side portion of a substrate according to the disclosure, and therefore a deposition mask is attached to the substrate to thereby mask the substrate side portion 10 to be formed with the wiring (s10).

The masking operation s10 of the substrate side portion includes operation of attaching the deposition mask to the substrate (see '30' in FIGS. 2 to 4) so that the wiring can be deposited on the substrate side portion 10 through sputtering. The deposition mask is formed to have a "["-shape, and thus attached to the top and bottom of the substrate as well as the side portion 10 of the substrate 30.

The deposition mask may be formed by a film, metal, and ink printing. In particular, the deposition mask may be given in the form of a polyimide (PI) film. When the PI film is used as the deposition mask, the deposition mask is closely attached to the substrate 30 including the substrate side portion 10 with various kinds of adhesive in between.

With adhesive interposed in between the PI film mask and the substrate 30, the PI film mask is first subjected to a provisional bonding process so as to be temporarily attached to the substrate 30 under a predetermined processing condition, and then subjected to a definite bonding process so as to be bonded to the substrate 30 under a predetermined processing condition.

When the masking operation of bonding the deposition mask to the substrate 30 including the substrate side portion 10, on which the wiring will be formed, is completed, sputtering operation is performed with regard to the masked substrate 30. That is, the masked substrate 30 is introduced into a chamber (see '110' in FIG. 4), and then the wiring is formed on the substrate side portion 10 through the sputtering (S30).

According to the disclosure, the wiring on the substrate side portion 10 is deposited by sputtering inside a vacuum chamber 110. Therefore, when the deposition mask having the "["-shape is attached to a portion of the substrate 30 including the substrate side portion 10 on which the wiring will be formed, the substrate 30 is transferred into the chamber 110 and undergoes a sputtering process.

The sputtering process is carried out so that the deposition can be focused upon the substrate side portion 10 on which the wiring will be formed. That is, the sputtering according to the disclosure is performed with regard to not the entire substrate 30 but the substrate side portion 10.

The method of forming the wiring on the substrate side portion 10 through the sputtering according to the disclosure refers to a method of using the sputtering to form the wiring on the side portion of the substrate 300, in which the substrate 30 may include any substrate as long as it is required to form a circuit pattern and connect the circuit pattern via the side portion. In other words, the substrate 30 according to the disclosure includes all sorts of substrates such as glass, plastic, film, etc. on which a circuit pattern is formed and of which a side portion may have wiring for electric connection with the circuit pattern.

Particularly, the substrate 30 according to the disclosure may include a substrate, a top and bottom of which are mounted with various elements and respectively formed with circuit patterns. Further, as shown in FIG. 2, the substrate side portion 10, on which the wiring will be formed, includes a lateral side 11 corresponding to an edge portion of the substrate; aside-adjacent top 13, i.e. a top of the substrate 30 adjacent to the lateral side 11; and a side-adjacent bottom 15, i.e. a bottom of the substrate 30 adjacent to the lateral side 11.

Figure 2:
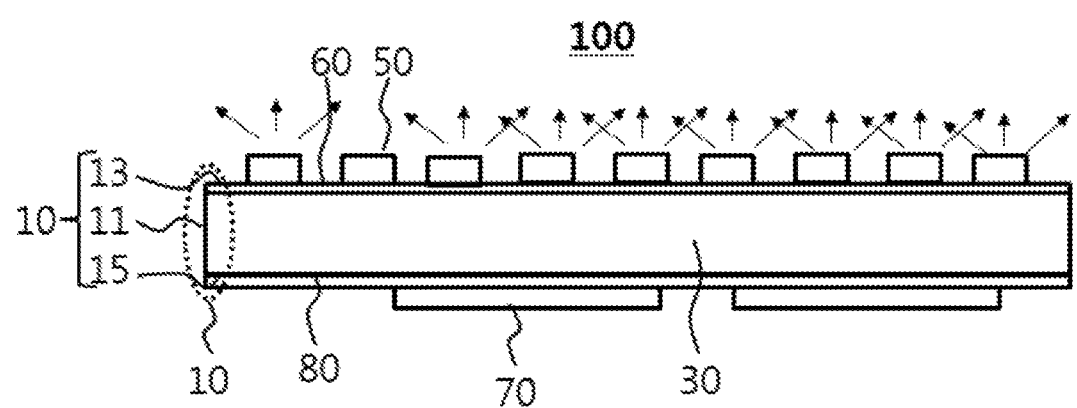
FIG. 2 shows an exemplary cross-section of a substrate to which a method of forming wiring on a side portion of a substrate is applied according to an embodiment of the disclosure.

Specifically, as shown in FIG. 2, the substrate side portion 10 according to the disclosure includes the lateral side 11 of the substrate 30, and the top (i.e. the side-adjacent top 13) and the bottom (i.e. the side-adjacent bottom 15) of the substrate which are adjacent to the lateral side 11 of the substrate 30, and the wiring on the substrate side portion 10, i.e. side portion wiring (see '90' in FIG. 3) is formed to electrically connect a top circuit pattern 60 formed on the top of the substrate 30 and a bottom circuit pattern 80 formed on the bottom of the substrate 30.

In more detail, the substrate 30 according to the disclosure may include a substrate used for various elements, devices and apparatuses. For example, the substrate 30 according to the disclosure may be used for a display apparatus 100 as shown in FIG. 2. In this case, display elements 50 such as liquid crystal display (LCD) elements, organic light emitting diodes (OLED), or micro light emitting diodes (LED) may be arrayed to form a display element matrix on the top of the substrate 30. Further, controller elements 70 for controlling the display elements 50 and transceiving an electric signal and various related elements may be formed on the bottom of the substrate 30.

The wiring for the display elements 50, i.e. the top circuit pattern 60 is formed on the top of the substrate 30, and the wiring for the controller elements 70 or the like, i.e. the bottom circuit pattern 80 is formed on the bottom of the substrate 30. Therefore, the side portion wiring 90 for electric connection between the top circuit pattern 60 and the bottom circuit pattern 80 has to be formed on the substrate side portion 10 as shown in FIG. 3.

Figure 3:
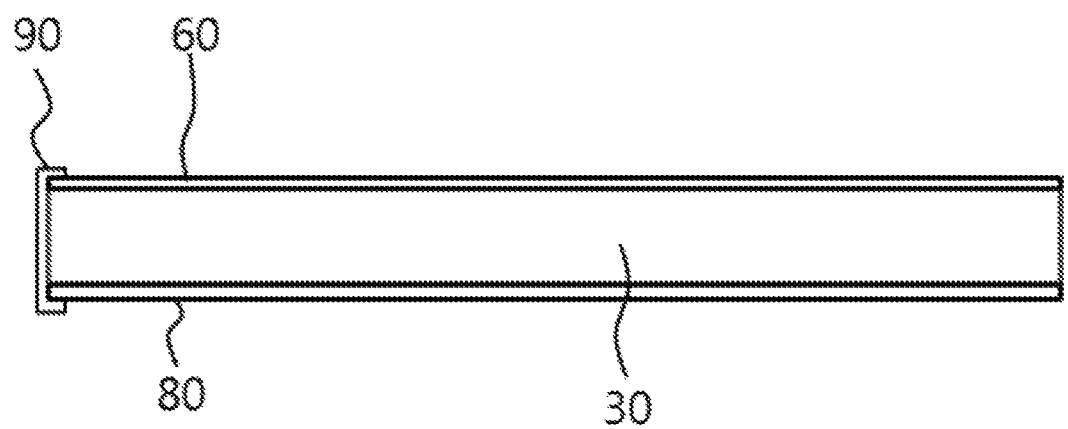
FIG. 3 shows a cross-section of a substrate of which a side portion is formed with wiring by a method of forming wiring on of a substrate according to an embodiment of the disclosure.

The side portion wiring 90 formed on the substrate side portion 10 has a cross-section of "⊏" as shown in FIG. 3 so as to electrically connect the top circuit pattern 60 and the bottom circuit pattern 80. Because the side portion wiring 90 has the "⊏"-shape for the electric connection between the top circuit pattern 60 and the bottom circuit pattern 80, the substrate side portion 10 formed with the side portion wiring 90 corresponds to a portion that includes not only the lateral side 11 of the substrate 30 but also the side-adjacent top 13 and the side-adjacent bottom 15 as shown in FIG. 2.

Figure 4:
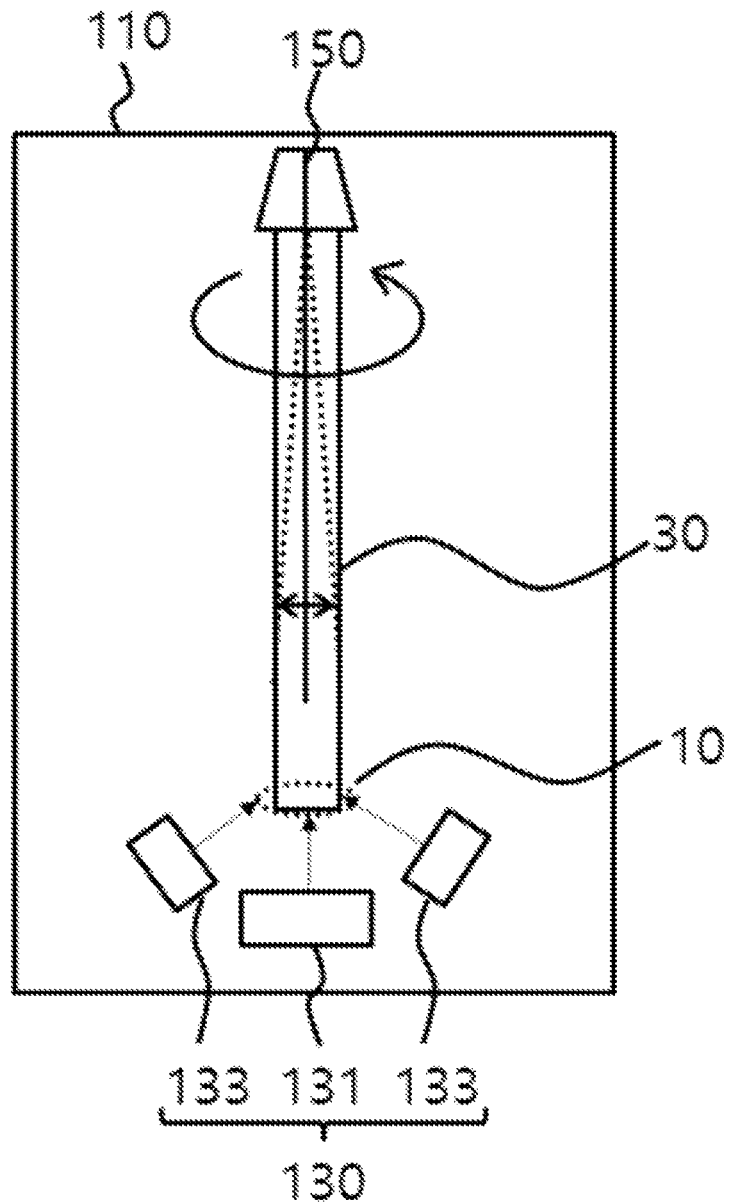
FIG. 4 shows a schematic cross-section of a sputtering apparatus employed to carry out a method of forming wiring on a side portion of a substrate according to an embodiment of the disclosure.

As described above, the masked substrate 30 is introduced into the vacuum chamber 110 as shown in FIG. 4 and subjected to the sputtering. Here, the sputtering in the vacuum chamber 110 is a process for forming the side portion wiring 90 on the substrate side portion 10. Therefore, the sputtering in the vacuum chamber 110 is performed to focus the deposition on the substrate side portion 10.

To this end, the wiring (i.e. the side portion wiring 90) to be formed on the substrate side portion according to the disclosure is deposited inside the chamber 110 by the sputtering using a central source target 131 disposed to face the lateral side 11 of the substrate 30, and side source targets 133 disposed at opposite sides of the central source target 131 and inclined toward the substrate 30.

Specifically, the masked substrate 30 (a deposition mask is attached to the top and bottom of the substrate including the substrate side portion 10 as described above even though the mask is not illustrated in FIG. 4) is disposed vertically with the substrate side portion 10 facing downward as shown in FIG. 4.

Because the substrate 30 is vertically disposed to make the substrate side portion 10 face downward in the vacuum chamber 110, a source target 130 for deposition on the substrate side portion 10 based on the sputtering is placed at a lower side of the vacuum chamber 110 and oriented toward the substrate side portion 10.

Like this, the source target 130 includes the central source target 131, and two side source targets 133 respectively arranged at the lateral sides of the central source target 131. The central source target 131 is disposed in parallel with the substrate 30 disposed vertically, and is opposite the lateral side 11 of the substrate side portion 10 in the substrate 30. Therefore, the central source target 131 is in main charge of main deposition on the lateral side 11 of the substrate 30.

One pair of side source targets 133 are respectively arranged at both sides of the central source target 131, and inclined toward the substrate 30. That is, one pair of side source targets 133 are respectively arranged one by one facing toward the side-adjacent top 13 and the side-adjacent bottom 15 which constitute the substrate side portion 10.

In this case, both the side source targets 133 may be also arranged to face toward even the lateral side 11 of the substrate 30 as shown in FIG. 4. Because the lateral side 11 of the substrate occupies a large percentage of the substrate side portion 10 corresponding to the portion where the wiring is formed, and deposition, and has a larger deposition range, the side source targets 133 are arranged to affect the sputtering deposition on not only the side-adjacent top and bottoms 13 and 15 but also the lateral side 11 of the substrate 30. In other words, the side source targets 133 are arranged and inclined to face toward the side-adjacent top and bottom 13 and 15 and the lateral side 11 of the substrate 30.

The substrate 30 is disposed vertically as shown in FIG. 4, as mounted to a jig (not shown), and rotatable or adjustable in angle to have various postures in order to enhance the uniformity and efficiency of the deposition. That is, the substrate 30 mounted to the jig inside the chamber 110 is rotatable with respect to the lengthwise direction of the substrate 30 as a rotational axis and adjustable in angle to face toward the central source target 131.

Specifically, the jig (not shown) is connected to the chamber 110 by a jig connector 150 having a predetermined shape and stably firmed to hold the substrate 30 so that the substrate 30 can be mounted to the jig (not shown) inside the chamber 110 and disposed vertically.

To change the posture of the substrate 30 held by and mounted to the jig, the jig may be rotatable or inclined at a predetermined angle with respect to the jig connector 150. To this end, various structures are possible. For example, as shown in FIG. 4, the jig connector 150 is rotatable and adjustable in angle leftward or rightward (i.e. in directions toward the side source targets 133), and thus the substrate 30 mounted to the jig is also rotatable with respect to the lengthwise direction of the substrate 30 as a rotational axis and adjustable in angle toward the side source targets 133, thereby adjusting an angle to direct the lateral side 11 of the substrate toward the central source target 131.

With the foregoing operation of the jig, the substrate 30 can have various postures and various angles toward the source target 130, and thus the uniformity of the deposition is adjustable as necessary during the sputtering, thereby forming the uniform wiring.

Meanwhile, a method of forming wiring on a side portion of a substrate according to the disclosure may further include operation s11 of cleaning the substrate before the foregoing operation s10 of masking the substrate side portion.

The operation s11 of cleaning the substrate performs cleaning the surface of the substrate through a plasma process before the masking operation. Before the masking operation, fine particles may be present on the surface of the substrate 30. For fine cleaning to remove such fine particles, plasma-based cleaning operation may be further performed. Like this, the masking operation is applied to the substrate subjected to the cleaning operation, thereby preventing a bad influence of fine particles.

Further, a method of forming wiring on a side portion of a substrate according to the disclosure may further include a preprocessing operation s31 of preprocessing the substrate 30 by an ion beam process inside the chamber 110 before operation of forming the wiring (i.e. the side portion wiring 90) on the substrate side portion 10.

In other words, to enhance adhesive force and close contact in the deposition between the substrate side portion 10 and the side portion wiring 90 having a predetermined pattern, the ion beam process is performed inside the vacuum chamber 119 before the operation s30 of forming the side portion wiring 90 on the substrate side portion 10. To this end, an ion beam generator (e.g., an ion beam gun) for processing an ion beam is just added inside the vacuum chamber 110.

Like this, both the preprocessing process using the ion beam and the process for forming the side portion wiring 90 are successively performed inside the chamber 110 at a time, and therefore the processes are simplified to efficiently proceed with the substrate fabricating process.

Meanwhile, the foregoing operation s30 of forming the wiring on the substrate side portion is achieved by the sputtering deposition inside the chamber 110, in which the wiring on the substrate side portion 10 may be formed having one metal layer, i.e. having only a conductive metal layer corresponding to the minimum metal layer as the wiring, but may include an adhesive metal layer, a conductive metal layer and a protective metal layer which are stacked in sequence to form high-quality wiring.

That is, the wiring (i.e. the side portion wiring 90) formed on the substrate side portion 10 according to the disclosure is formed by sequentially stacking the adhesive metal layer, the conductive metal layer, and the protective metal layer.

The adhesive metal layer may contain a conductive material, e.g. a metallic material. The metallic material may include one of alloy of nickel (Ni) and chrome (Cr), titanium (Ti), molybdenum (Mo), stainless (SUS), or alloy of them as a single layer or a multiple layer.

For example, the adhesive metal layer may contain alloy of nickel and chrome. A weight ratio of nickel to chrome in the adhesive metal layer including nickel and chrome may be selected within a range of 8:2 to 9.5:0.5. Chrome may improve enhance the adhesive force between the substrate (in particular, a plastic substrate) and the conductive metal layer. The adhesive metal layer made of the alloy of nickel and chrome may improve the adhesive force between the substrate and the conductive layer more than about 1.5 times stronger than that of the adhesive metal layer that contains only nickel.

When the adhesive metal layer contains the alloy of nickel and chrome, the sputtering process is improved in thin-film forming efficiency as compared with that of the adhesive metal layer that contains only nickel. The sputtering performed using only nickel having magnetism may lower the thin-film thickness uniformity or the like quality of the adhesive metal layer. However, the sputtering performed using the alloy of nickel and chrome according to an embodiment of the disclosure improves the quality of the formed thin film, and enhances the adhesive force between the substrate and the conductive metal layer as described above.

After the adhesive metal layer is formed on the substrate side portion 10 by the sputtering, the conductive metal layer is formed on the adhesive metal layer. The conductive metal layer may be formed including various kinds of metal or alloy. For example, the conductive metal layer may contain copper, or may be provided as a tin (Sn)-based lead-free metal layer which contains tin (Sn) of not lower than about 85 wt %. Besides tin (Sn), the conductive metal layer may contain at least one among silver (Ag), copper (Cu), bismuth (Bi), Zinc (Zn), and indium (In). In a case where the conductive metal layer contains silver (Ag) and copper (Cu), the conductive metal layer may contain silver (Ag) more than copper (Cu) to have a lower melting point.

After the conductive metal layer is deposited on the adhesive metal layer by the sputtering as described above, the protective metal layer is deposited on the conductive metal layer inside the same chamber 110 by the sputtering.

The protective metal layer may contain a metallic material. For example, the protective metallic material may include one of alloy of nickel (Ni) and chrome (Cr), titanium (Ti), molybdenum (Mo), stainless (SUS), or alloy of them, like the adhesive metal layer. Preferably, the protective metal layer is made of the same material as the adhesive metal layer inside the same chamber 110. Like this, the adhesive metal layer and the protective metal layer are made of the same material inside one chamber, thereby simplifying the whole processes and thus minimizing time, efforts and costs of fabricating the substrate. The protective metal layer protects the conductive metal layer from corrosion and contamination during fabrication, distribution and the like processes.

Meanwhile, as described above, the wiring formed on the substrate side portion 10 are formed by sequentially stacking the adhesive metal layer, the conductive metal layer and the protective metal layer inside the chamber by the sputtering, and therefore each metal layer can be subjected to the ion beam process. In other words, the chamber 110 for the method of forming the wiring on the side portion of the substrate according to the disclosure supports the ion beam process as described above, and therefore the ion beam process is performed before forming each metal layer, thereby enhancing attachment, adhesion, and close-contact between the substrate and the adhesive metal layer and between the metal layers.

Specifically, inside one chamber, the substrate side portion 10 is first subjected to the ion beam process, and then the adhesive metal layer is deposited on the substrate side portion 10 by the sputtering. Next, the adhesive metal layer is subjected to the ion beam process, and then the conductive metal layer is deposited on the adhesive metal layer by the sputtering. Next, the conductive metal layer is subjected to the ion beam process, and then the protective metal layer is deposited on the conductive metal layer by the sputtering. Like this, the ion beam processes are performed in one chamber before forming the metal layers, thereby enhancing close contact between the substrate and the metal layer and between the metal layers through a simplified process and a simplified apparatus structure and thus improving efficiency of fabricating the substrate.

Meanwhile, when the foregoing operation s30 of forming the wiring on the substrate side portion 10 is completed, the substrate 30 is taken out, and undergoes a wiring test, a visual test, etc. after removing the mask (s50)

With the foregoing method of forming wiring on a side portion of a substrate according to the disclosure for the technical problems and solutions, the sputtering is used to form the wiring on the substrate side portion, thereby having effects on forming the wiring with low resistance and thus providing the substrate improved in electric characteristics.

Further, according to the disclosure, a top circuit pattern and a bottom circuit pattern of the substrate are electrically connectable through the wiring formed by sputtering to the side portion, thereby having advantages of removing a bezel and thus achieving a large-screen and high-definition display apparatus.

Although a few exemplary embodiments of the disclosure have been shown and described, these are for illustrative purpose only and it will be appreciated by those skilled in the art that changes may be made in these embodiments without departing from the principles and spirit of the invention, the scope of which is defined in the appended claims and their equivalents.

What is claimed is:

1. A method of forming wiring of a substrate, comprising:
   masking a substrate side portion, on which the wiring will be formed, by attaching a deposition mask to the substrate, wherein the substrate side portion includes a lateral side corresponding to an edge portion of the substrate, a side-adjacent top corresponding to a top of the substrate adjacent to the lateral side and a side-adjacent bottom corresponding to a bottom of the substrate adjacent to the lateral side; and
   forming the wiring on the masked substrate side portion based on sputtering after introducing the masked substrate side portion into a chamber,
   wherein the wiring formed on the masked substrate side portion is deposited inside the chamber based on sputtering using a central source target disposed to face the lateral side of the substrate side portion, and side source targets disposed at opposite sides of the central source target and inclined toward the substrate to face the side-adjacent top and the side-adjacent bottom,
   wherein one end, which is an opposite side of the substrate side portion, of the substrate is connected to a jig connector inside the chamber, and the other end, which is the substrate side portion, of the substrate is adjustable in angle to face toward the central source target, wherein the substrate is rotatable with respect to a lengthwise direction of the substrate as an axis so that the substrate side portion is sputtered by the central source target and the side source targets.

2. The method according to claim 1, wherein the wiring the masked substrate side portion is configured to electrically connect a top circuit pattern formed on the side-adjacent top of the substrate side portion and a bottom circuit pattern formed on the side-adjacent bottom of the substrate side portion.

* * * * *